(12) United States Patent
Yeh et al.

(10) Patent No.: US 12,249,979 B2
(45) Date of Patent: Mar. 11, 2025

(54) SIGNAL CONVERTING CIRCUIT

(71) Applicant: Realtek Semiconductor Corporation, Hsinchu (TW)

(72) Inventors: Chien-Tsu Yeh, Hsinchu (TW); Hsi-En Liu, Hsinchu (TW); Yi-Chun Hsieh, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 57 days.

(21) Appl. No.: 18/173,785

(22) Filed: Feb. 24, 2023

(65) Prior Publication Data

US 2023/0291397 A1 Sep. 14, 2023

(30) Foreign Application Priority Data

Mar. 9, 2022 (TW) .................................. 111108669

(51) Int. Cl.
*H03K 17/14* (2006.01)
*H03K 5/00* (2006.01)
*H03K 5/01* (2006.01)

(52) U.S. Cl.
CPC ............... *H03K 17/14* (2013.01); *H03K 5/01* (2013.01); *H03K 2005/00286* (2013.01)

(58) Field of Classification Search
CPC . H03K 17/14; H03K 5/01; H03K 2005/00286
See application file for complete search history.

(56) References Cited

U.S. PATENT DOCUMENTS

2014/0125394 A1   5/2014  Hood et al.
2016/0191041 A1*  6/2016  Chung ................... G05F 1/463
                                                            327/143

* cited by examiner

*Primary Examiner* — Menatoallah Youssef
*Assistant Examiner* — Colleen J O Toole
(74) *Attorney, Agent, or Firm* — CKC & Partners Co., LLC (57) ABSTRACT

A signal converting circuit includes a phase interpolator circuit and a bias voltage generation circuit. The phase interpolator circuit is configured to convert a plurality of input clock signals into an output clock signal according to a digital signal. The bias voltage generation circuit is electrically coupled to the phase interpolator circuit, is configured to generate a bias voltage according to a reference information and is configured to output the bias voltage to the phase interpolator circuit, so that the output clock signal has a predetermined phase corresponding to one of a plurality of bit configurations of the digital signal, wherein the reference information is relevant to a change of the phase interpolator circuit due to a temperature variation.

12 Claims, 6 Drawing Sheets

SIGNAL CONVERTING CIRCUIT

CROSS-REFERENCE TO RELATED APPLICATION

This application claims priority to Taiwan Application Serial Number 111108669, filed Mar. 9, 2022, which is herein incorporated by reference in its entirety.

BACKGROUND

Field of Invention

This disclosure relates to a circuit, and in particular to a signal converting circuit.

Description of Related Art

The phase interpolator of prior art has worse linearity due to the influence of the manufacture process variation, the temperature variation, or a combination thereof, which results in many limitations on its applications. Therefore, it is necessary to improve the phase interpolator of prior art to solve the present problems.

SUMMARY

An aspect of present disclosure relates to a signal converting circuit. The signal converting circuit includes a phase interpolator circuit and a bias voltage generation circuit. The phase interpolator circuit is configured to convert a plurality of input clock signals into an output clock signal according to a digital signal. The bias voltage generation circuit is electrically coupled to the phase interpolator circuit, is configured to generate a bias voltage according to a reference information and is configured to output the bias voltage to the phase interpolator circuit, so that the output clock signal has a predetermined phase corresponding to one of a plurality of bit configurations of the digital signal, wherein the reference information is relevant to a change of the phase interpolator circuit due to a temperature variation.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more components are directly in physical or electrical contact, or are indirectly in physical or electrical contact with each other. It can also mean that two or more components interact with each other.

For convenience of descriptions, indexes 1-$n$ in reference labels of components used in the specification and drawings of this application are only for convenience of referring to respective components and are not intended to restrict the amount of components to any specific number. In the specification and drawings of this application, if a reference label of a particular component is used without the index, it means that the reference label of the particular component refers to any unspecific component of corresponding component group. For example, the reference label TP[1] refers to the transistor pair TP[1], and the reference label TP refers to any unspecific transistor pair of the transistor pairs TP[1]-TP[n].

Figure 1:
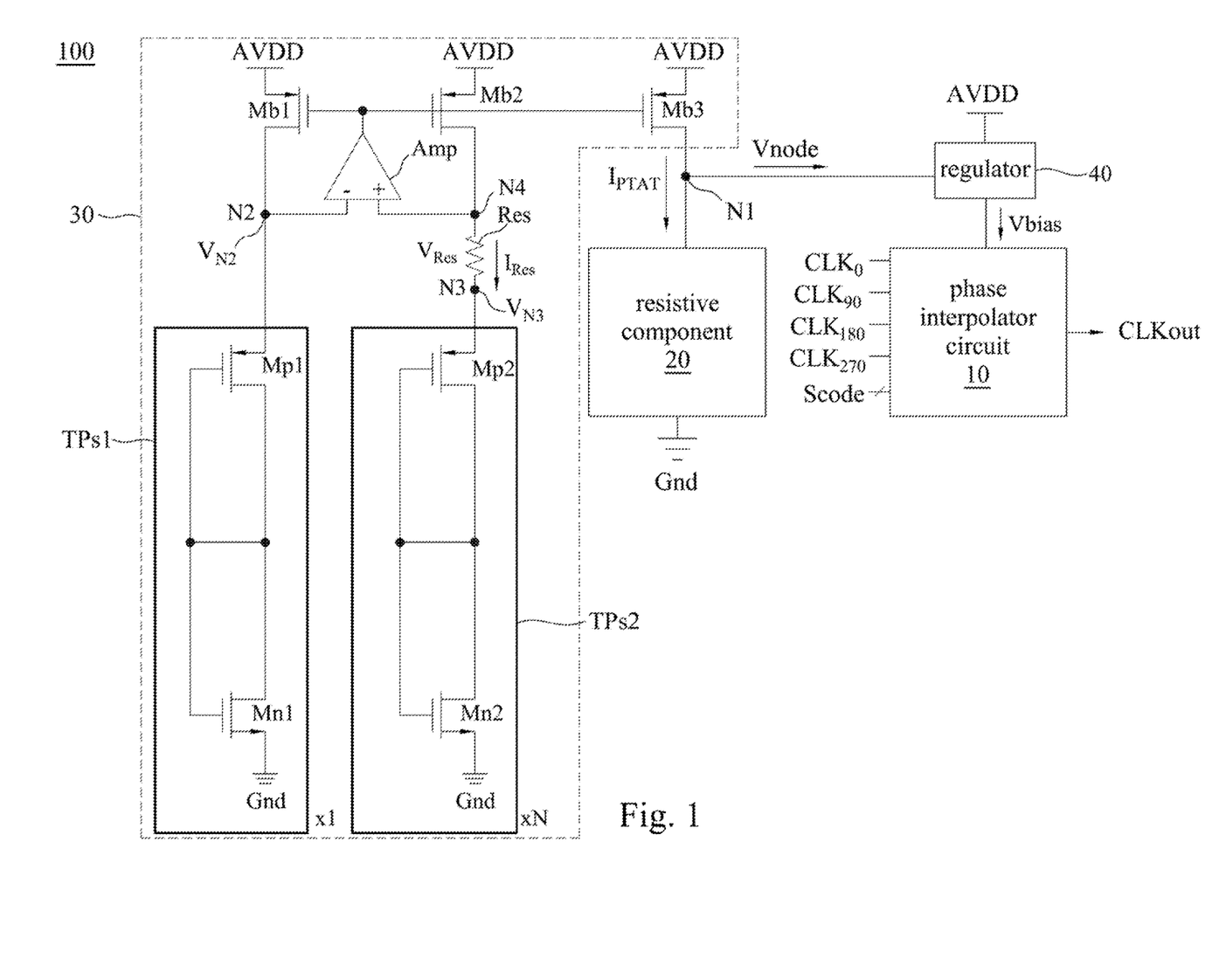
FIG. 1 is a schematic diagram of a signal converting circuit in accordance with some embodiments of the present disclosure.

Referring to FIG. 1, FIG. 1 is a schematic diagram of a signal converting circuit 100 in accordance with some embodiments of the present disclosure. The signal converting circuit 100 includes a phase interpolator circuit 10 and a bias voltage generation circuit. In some embodiments, as shown in FIG. 1, the bias voltage generation circuit includes a resistive component 20, a temperature sensitive circuit 30 and a regulator 40. In structure, the resistive component 20 and the temperature sensitive circuit 30 are coupled at a node N1, and the regulator 40 is coupled among the node N1, a system high voltage AVDD and the phase interpolator circuit 10.

In some embodiments, the resistive component 20 can be implemented by a resistor that has a predetermined resistance. The regulator 40 can be implemented by a low-dropout regulator (LDO).

In the embodiments of FIG. 1, the bias voltage generation circuit can provides a bias voltage Vbias to the phase interpolator circuit 10 through the regulator 40, and the phase interpolator circuit 10 is configured to convert a plurality of input clock signals $CLK_0$, $CLK_{90}$, $CLK_{180}$ and $CLK_{270}$ into an output clock signal CLKout according to a digital signal Scode. The structure and operation of the phase interpolator circuit 10 would be described in detail below with reference to FIG. 2.

Figure 2:
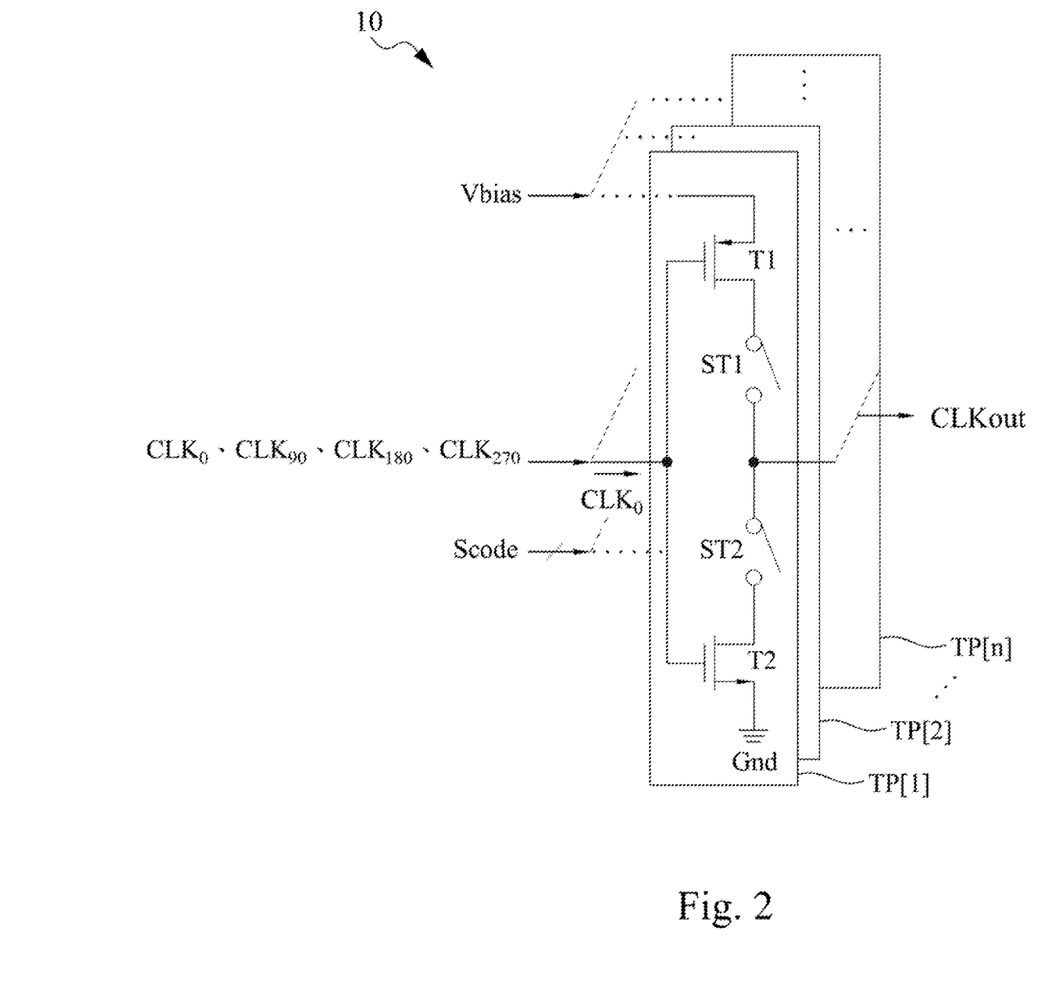
FIG. 2 is a schematic diagram of a phase interpolator circuit in accordance with some embodiments of the present disclosure.

Referring to FIG. 2, FIG. 2 is a schematic diagram of the phase interpolator circuit 10 in accordance with some embodiments of the present disclosure. In some embodiments, as shown in FIG. 2, the phase interpolator circuit 10 includes a plurality of transistor pairs TP[1]-TP[n] connected in parallel between the bias voltage Vbias and a ground voltage Gnd, where n is a positive integer greater than 1.

In some embodiments, the transistor pairs TP[1]-TP[n] are divided into a plurality of groups, and each group of transistor pair is configured to receive a corresponding input clock signal of the input clock signals $CLK_0$, $CLK_{90}$, $CLK_{180}$ and $CLK_{270}$. In detail, the input clock signal $CLK_0$ represents a clock signal having a phase of 0 degree, the input clock signal $CLK_{90}$ represents a clock signal having a phase of 90 degrees, the input clock signal $CLK_{180}$ represents a clock signal having a phase of 180 degrees, and the input clock signal $CLK_{270}$ represents a clock signal having a phase of 270 degrees. In other words, the input clock signals $CLK_0$, $CLK_{90}$, $CLK_{180}$ and $CLK_{270}$ inputted to the phase interpolator circuit 10 are different from each other in phase.

In some practical applications, the phase interpolator circuit 10 includes 32 transistor pairs TP[1]-TP[32], and the 32 transistor pairs TP[1]-TP[32] are divided into 4 groups. In other words, the transistor pairs TP[1]-TP[8] are one group, the transistor pairs TP[9]-TP[16] are one group, the transistor pairs TP[17]-TP[24] are one group, and the transistor pairs TP[25]-TP[32] are one group. The transistor pairs TP[1]-TP[8] receive the input clock signal $CLK_0$, the transistor pairs TP[9]-TP[16] receive the input clock signal $CLK_{90}$, the transistor pairs TP[17]-TP[24] receive the input clock signal $CLK_{180}$, and the transistor pairs TP[25]-TP[32] receive the input clock signal $CLK_{270}$.

In some embodiments, the structures of the transistor pairs TP[1]-TP[n] are the same as each other. The structure of the transistor pair TP would be described below by taking the transistor pair TP[1] as an example. As shown in FIG. 2, the transistor pair TP[1] includes a first transistor T1, a second transistor T2, a first switch ST1 and a second switch ST2. A first terminal (e.g., source terminal) of the first transistor T1 receives the bias voltage Vbias, and a first terminal (e.g., source terminal) of the second transistor T2 receives the ground voltage Gnd. A control terminal (e.g., gate terminal) of the first transistor T1 and a control terminal (e.g., gate terminal) of the second transistor T2 receive the input clock signal $CLK_0$ (or, one of the input clock signals $CLK_0$, $CLK_{90}$, $CLK_{180}$ and $CLK_{270}$). The first switch ST1 and the second switch ST2 are connected in series and then are coupled between a second terminal (e.g., drain terminal) of the first transistor T1 and a second terminal (e.g., drain terminal) of the second transistor T2.

In some embodiments, the digital signal Scode has a plurality of bits, and the amount of the bits of the digital signal Scode is same as the amount of the transistor pairs TP[1]-TP[n]. The transistor pairs TP[1]-TP[n] each receives a corresponding bit of the bits of the digital signal Scode. For example, the transistor pair TP[1] receives a $1^{st}$ bit of the digital signal Scode, and the transistor pair TP[2] receives a $2^{nd}$ bit of the digital signal Scode. Furthermore, each bit of the digital signal Scode has a logic value. Accordingly, the first switch ST1 and the second switch ST2 of the transistor pair TP[1] can be selectively turned on according to the logic value (i.e., logic "0" or logic "1") of the $1^{st}$ bit of the digital signal Scode. In the embodiments of FIG. 2, the first switch ST1 and the second switch ST2 of the transistor pair TP[1] are simultaneously turned on or off. The operations of switches in the remaining transistor pairs TP[2]-TP[n] can be deduced by analogy, and therefore are not repeatedly described herein.

It can be appreciated that the digital signal Scode can have a plurality of bit configurations, and the bit configurations represent different arrangements of the bits of the digital signal Scode. In some practical applications, the digital signal Scode is 32 bits and is composed of 8 logic "1" and 24 logic "0". For example, at a certain time, the $1^{st}$ to $8^{th}$ bits of the digital signal Scode are logic "1", the $9^{th}$ to $32^{th}$ bits of the digital signal Scode are logic "0", and this is one of the bit configurations of the digital signal Scode. The remaining bit configurations of the digital signal Scode can be deduced by analogy, and therefore are not described herein.

In some embodiments, the digital signal Scode can be controlled by the operator to have a specific bit configuration (that is, one of the bit configurations of the digital signal Scode). The transistor pairs TP[1]-TP[n] of the phase interpolator circuit 10 perform an interpolation on the input clock signals $CLK_0$, $CLK_{90}$, $CLK_{180}$ and $CLK_{270}$ according to the digital signal Scode with specific bit configuration, to synthesize the output clock signal CLKout. In theory, the output clock signal CLKout generated by the phase interpolator circuit 10 according to the digital signal Scode should have a specific phase (i.e., a phase predetermined by the operator) corresponding to the specific bit configuration. In other words, the digital signals Scode with different bit configuration should correspond to the output clock signals CLKout with different phase. However, the phase interpolator circuit 10 is often affected by the temperature variation in practice, so that the output clock signals CLKout does not have the phase predetermined by the operator.

Notably, by using the bias voltage Vbias provided by the bias voltage generation circuit, the error of the phase interpolator circuit 10 due to the temperature variation can be calibrated, so that the output clock signal CLKout outputted by the phase interpolator circuit 10 can have a predetermined phase corresponding to one of the bit configurations of the digital signal Scode. It can be appreciated that the predetermined phase can be any phase between 0 to 360 degrees. The generation of the bias voltage Vbias would be described in detail below.

In some embodiments, the bias voltage generation circuit is configured to generate the appropriate bias voltage Vbias to the phase interpolator circuit 10 according to a reference information (not shown) relevant to a change of the phase interpolator circuit 10 due to the temperature variation. In the embodiments of FIG. 1, the reference information is provided by the temperature sensitive circuit 30. In detail, as shown in FIG. 1, the temperature sensitive circuit 30 is configured to generate a current $I_{PTAT}$ (i.e., the temperature dependent current) proportional to absolute temperature according to, for example an operating temperature of the signal converting circuit 100. In other words, the current $I_{PTAT}$ has positive correlation with temperature. For example, the current $I_{PTAT}$ increases as the temperature increases and also decreases as the temperature decreases.

In the embodiments of FIG. 1, the temperature sensitive circuit 30 includes an amplifier Amp, a first reference transistor pair TPs1, a second transistor pair TPs2, a resistor Res and a plurality of bias transistors Mb1-Mb3. It can be appreciated that the amplifier Amp has a positive input terminal (which is presented by the symbol "+" in FIG. 1), a negative input terminal (which is presented by the symbol "−" in FIG. 1) and an output terminal. The first reference transistor pair TPs1 and the negative input terminal of the amplifier Amp are coupled at a node N2. The second transistor pair TPs2 is coupled at a node N3. The resistor Res and the second transistor pair TPs2 are coupled at the node N3, and the resistor Res and the positive input terminal of the amplifier Amp are coupled at a node N4. A control terminal of the bias transistor Mb1, a control terminal of the bias transistor Mb2 and a control terminal of the bias transistor Mb3 are coupled to the output terminal of the amplifier Amp. A first terminal of the bias transistor Mb1, a first terminal of the bias transistor Mb2 and a first terminal of the bias transistor Mb3 receive the system high voltage AVDD. In addition, a second terminal of the bias transistor Mb1 is coupled at the node N2, a second terminal of the bias transistor Mb2 is coupled at the node N4, and a second terminal of the bias transistor Mb3 is coupled at the node N1.

In some embodiments, the bias transistors Mb1-Mb3 each is implemented by a P-type metal oxide semiconductor field effect transistor (MOSFET). It can be appreciated that the control terminals of the bias transistors Mb1-Mb3 each can be a gate terminal, the first terminals of the bias transistors Mb1-Mb3 each can be a source terminal, and the second terminals of the bias transistors Mb1-Mb3 each can be a drain terminal.

Referring to FIG. 1 again, the first reference transistor pair TPs1 includes a transistor Mp1 and a transistor Mn1. A first terminal of the transistor Mp1 is coupled at the node N2, a first terminal of the transistor Mn1 is coupled to the ground voltage Gnd, and a control terminal and a second terminal of the transistor Mp1 and a control terminal and a second terminal of the transistor Mn1 are coupled together. The second reference transistor pair TPs2 includes a transistor Mp2 and a transistor Mn2. A first terminal of the transistor Mp2 is coupled at the node N3, a first terminal of the transistor Mn2 is coupled to the ground voltage Gnd, and a control terminal and a second terminal of the transistor Mp2 and a control terminal and a second terminal of the transistor Mn2 are coupled together. In the embodiments of FIG. 1, the second reference transistor pair TPs2 is N times larger than the first reference transistor pair TPs1 in size (or aspect ratio), where N is a positive integer greater than 1.

In some embodiments, the transistor Mp1 and the transistor Mp2 each is implemented by a P-type MOSFET, and the transistor Mn1 and the transistor Mn2 each is implemented by a N-type MOSFET.

During the operating period of the temperature sensitive circuit 30, the first reference transistor pair TPs1 is biased by the bias transistor Mb1 to form a voltage $V_{N2}$ at the node N2, and the voltage $V_{N2}$ is equivalent to twice a voltage difference between the control terminal and the first terminal of the transistor Mn1. In addition, the second reference transistor pair TPs2 is biased by the bias transistor Mb2 to form a voltage $V_{N3}$ at the node N3, and the voltage $V_{N3}$ is equivalent to twice a voltage difference between the control terminal and the first terminal of the transistor Mn2.

In the embodiments of FIG. 1, the amplifier Amp, the bias transistor Mb1 and the first reference transistor pair TPs1 constitute a positive feedback path, and a gain of the positive feedback path can be substantially presented by a formula (1):

$$|-gm_{Mb1} \times R_{TPs1} \times -A_{OP}| \qquad (1),$$

where $-gm_{Mb1}$ is a gain of the bias transistor Mb1, $R_{TPs1}$ is an equivalent resistance of the first reference transistor pair TPs1, and $A_{OP}$ is a gain of the amplifier Amp.

Furthermore, the amplifier Amp, the second bias transistor Mb2, the resistor Res and the second reference transistor pair TPs2 constitute a negative feedback path, and a gain of the negative feedback path can be substantially presented by a formula (2):

$$|-gm_{Mb2} \times (R_{Res} + R_{TPs2}) \times A_{OP}| \qquad (2),$$

where $-gm_{Mb2}$ is a gain of the bias transistor Mb2, $R_{Res}$ is a resistance of the resistor Res, and $R_{TPs2}$ is an equivalent resistance of the second reference transistor pair TPs2.

In the embodiments of FIG. 1, the resistance of the resistor Res is much greater than the equivalent resistance of the first reference transistor pair TPs1 or the second reference transistor pair TPs2, and the bias transistor Mb1 and the bias transistor Mb2 have same gain. Through the calculation of the formulas (1) and (2), it can be appreciated that the negative feedback path is greater than the positive feedback path in gain. Therefore, the negative feedback of the amplifier Amp is established, which further results in that the node N4 has a voltage same as the voltage $V_{N2}$ of the node N2.

Through the above descriptions, it can be appreciated that two different voltage $V_{N2}$ and $V_{N3}$ are applied to two terminals of the resistor Res respectively, so that a cross voltage $V_{Res}$ is generated. Furthermore, through the Ohm's Law, it can be appreciated that a current $I_{Res}$ is generated and flows through the resistor Res. It can be appreciated that the magnitude of the cross voltage $V_{Res}$ is the voltage $V_{N2}$ minus the voltage $V_{N3}$, and the magnitude of the current $I_{Res}$ is the cross voltage $V_{Res}$ divided by the resistance of the resistor Res. In addition, the current $I_{Res}$ is replicated by a current mirror circuit composed of the bias transistor Mb2 and the bias transistor Mb3, so that the second terminal of the bias transistor Mb3 generates the current $I_{PTAT}$ to the resistive component 20. Since the bias transistor Mb2 and the bias transistor Mb3 are manufactured with same manufacture process and have same size, the current $I_{PTAT}$ and the current $I_{Res}$ are substantially the same. That is, the magnitude of the current $I_{PTAT}$ is also the cross voltage $V_{Res}$ divided by the resistance of the resistor Res. In some embodiments, the magnitude of the cross voltage $V_{Res}$ has positive correlation with temperature. For example, the cross voltage $V_{Res}$ increases as the temperature increases and also decreases as the temperature decreases. Accordingly, the magnitude of the current $I_{PTAT}$ also has positive correlation with temperature.

As shown in FIG. 1, the current $I_{PTAT}$ outputted by the temperature sensitive circuit 30 flows through the resistive component 20, to generate a node voltage Vnode at the node N1. In the embodiments of FIG. 1, the magnitude of the node voltage Vnode is the magnitude of the current $I_{PTAT}$ multiplies the predetermined resistance of the resistive component 20. Then, the regulator 40 can receive and stable the node voltage Vnode to generate the bias voltage Vbias to the phase interpolator circuit 10.

Notably, since the first reference transistor pair TPs1 and the second reference transistor pair TPs2 in the temperature sensitive circuit 30 each has a structure similar to that of the transistor pair TP in the phase interpolator circuit 10, the current $I_{PTAT}$ generated by the temperature sensitive circuit 30 is relevant to the change of the phase interpolator circuit 10 due to the temperature variation. Accordingly, the bias voltage Vbias generated by the bias voltage generation circuit according to the resistive component 20 and the current $I_{PTAT}$ would have a voltage magnitude capable of compensating the temperature variation of the phase interpolator circuit 10.

For example, when the rise time or the fall time of the transistors inside the phase interpolator circuit 10 is shortened due to the low temperature, the current $I_{PTAT}$ generated by the temperature sensitive circuit 30 is relatively small. Since the resistance of the resistive component 20 is fixed, the bias voltage generation circuit generates a small bias voltage Vbias to the phase interpolator circuit 10 according to a small node voltage Vnode, to lengthen the rise or fall time of the transistors inside the phase interpolator circuit 10. For another example, when the rise time or the fall time of the transistors inside the phase interpolator circuit 10 is lengthened due to the high temperature, the current $I_{PTAT}$ generated by the temperature sensitive circuit 30 is relatively large. Since the resistance of the resistive component 20 is fixed, the bias voltage generation circuit generates a large bias voltage Vbias to the phase interpolator circuit 10 according to a large node voltage Vnode, to shorten the rise or fall time of the transistors inside the phase interpolator circuit 10.

In the embodiments of FIG. 1, the bias voltage generation circuit of the present disclosure generates the appropriate bias voltage Vbias according to the reference information relevant to the change of the phase interpolator circuit 10 due to the temperature variation, to compensate the phase interpolator circuit 10 affected by the temperature variation. However, the phase interpolator circuit 10 would also be affected by other variations in practice. Therefore, the present disclosure is not limited herein. In other embodiments, the phase interpolator circuit 10 is affected by the temperature variation and the manufacture process variation simultaneously, so that the bias voltage generation circuit of the present disclosure generates the appropriate bias voltage Vbias for the phase interpolator circuit 10 affected by the temperature variation and the manufacture process variation. These would be described in detail below with reference to FIG. 3.

Figure 3:
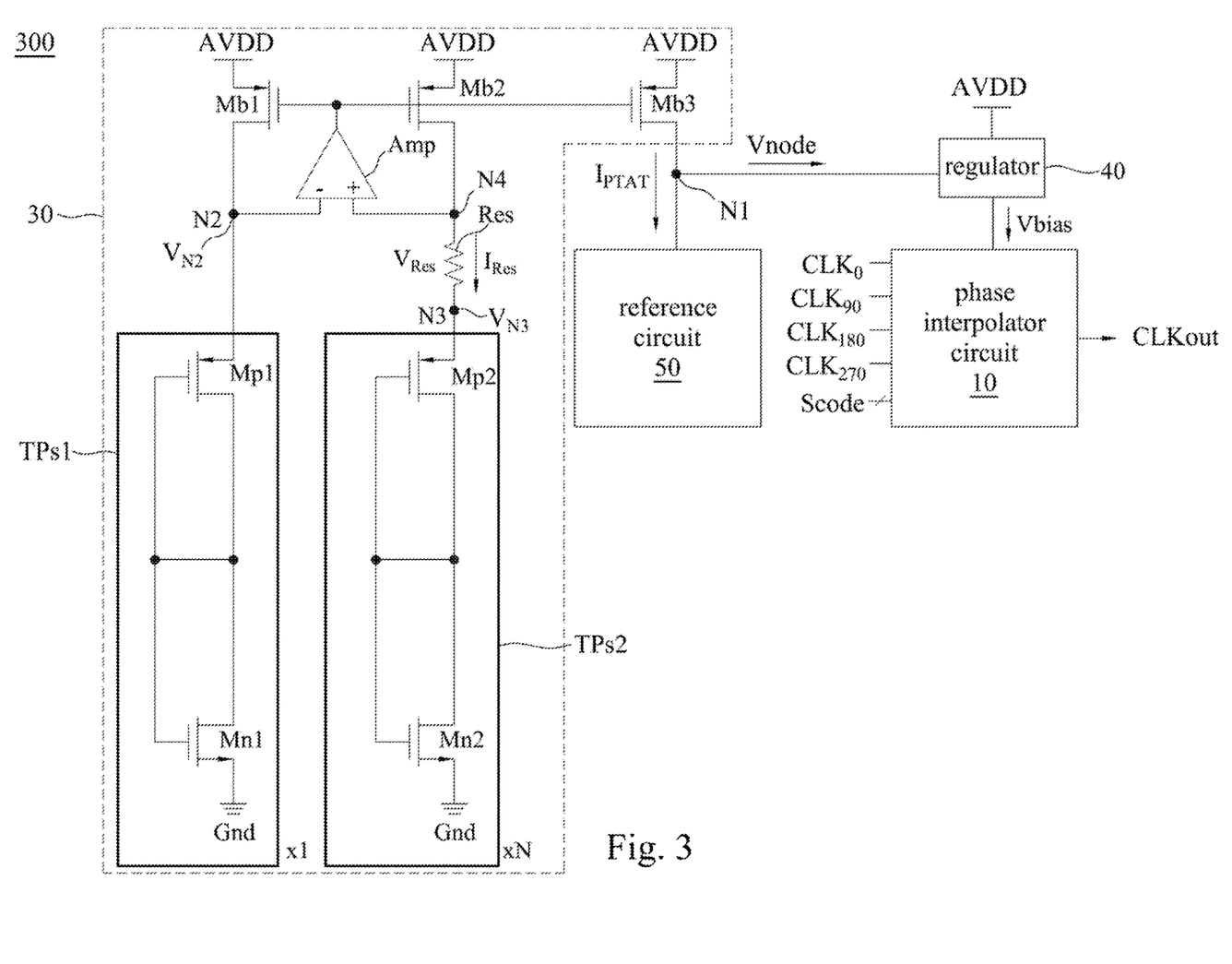
FIG. 3 is a schematic diagram of a signal converting circuit in accordance with some embodiments of the present disclosure.

Referring to FIG. 3, FIG. 3 is a schematic diagram of a signal converting circuit 300 in accordance with some embodiments of the present disclosure. It can be appreciated that the symbols in FIG. 3 which are same as those of FIG. 1 represent the same or similar components, and therefore are not described repeatedly. In the embodiments of FIG. 3, the bias voltage generation circuit of the signal converting circuit 300 includes a reference circuit 50. In structure, the reference circuit 50 substitutes for the resistive component 20 in FIG. 1 to be coupled at the node N1 with the temperature sensitive circuit 30, to provide a reference information relevant to the change of the phase interpolator circuit 10 due to the manufacture process variation.

In the embodiments of FIG. 3, the reference circuit 50 is a replicated circuit of the phase interpolator circuit 10, that is, the structure of the reference circuit 50 is substantially the same as the structure of the phase interpolator circuit 10. The structure of the reference circuit 50 would be described in detail below with reference to FIG. 4.

Figure 4:
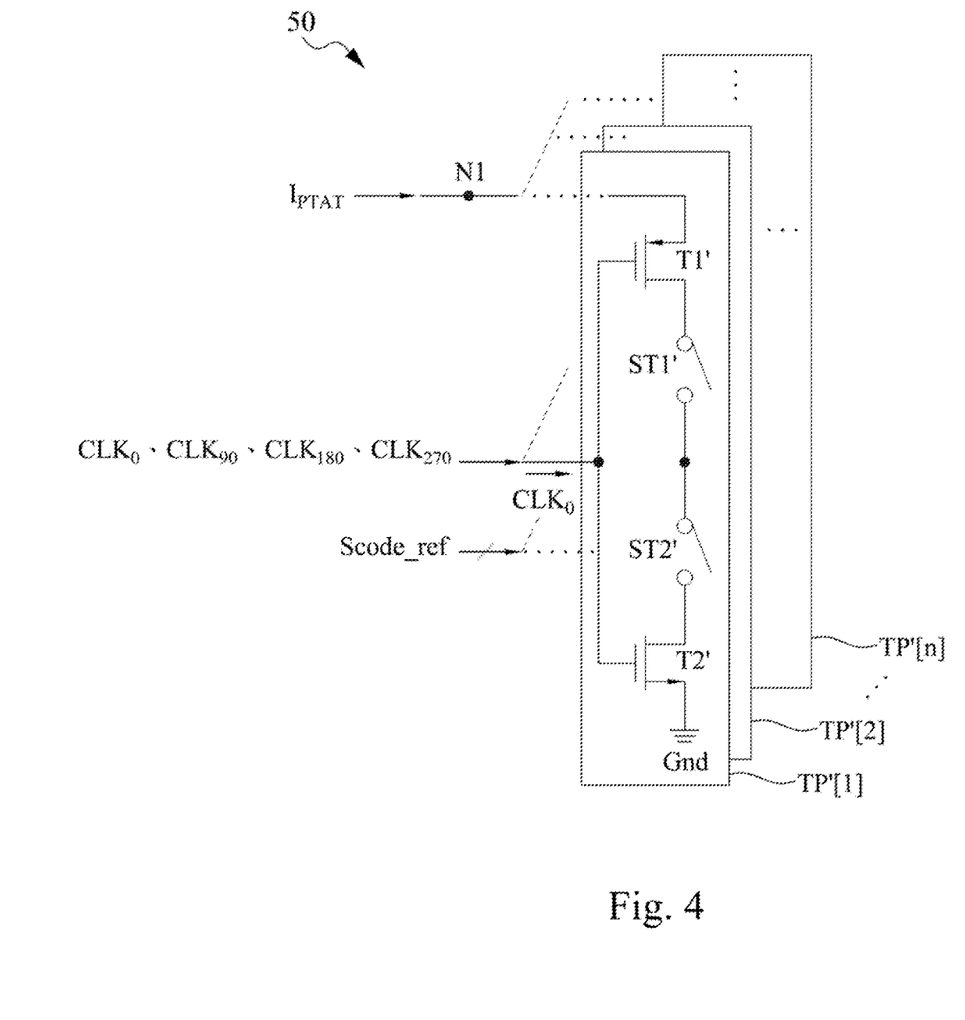
FIG. 4 is a schematic diagram of a reference circuit in accordance with some embodiments of the present disclosure.

Referring to FIG. 4, FIG. 4 is a schematic diagram of the reference circuit 50 in accordance with some embodiments of the present disclosure. The reference circuit 50 includes a plurality of transistor pairs TP'[1]-TP'[n] connected in parallel. For reflecting the change of the phase interpolator circuit 10 due to the manufacture process variation, the transistor pairs TP'[1]-TP'[n] of the reference circuit 50 are also divided into a plurality of groups in the same manner as the transistor pairs TP[1]-TP[n] of the phase interpolator circuit 10, to respectively receive the input clock signals $CLK_0$, $CLK_{90}$, $CLK_{180}$ and $CLK_{270}$ which are also inputted to the phase interpolator circuit 10.

Being similar to the transistor pairs TP[1]-TP[n] of the phase interpolator circuit 10, the structures of the transistor pairs TP'[1]-TP'[n] are the same as each other. The structure of the transistor pair TP' would be described below by taking the transistor pair TP'[1] as an example. As shown in FIG. 4, the transistor pair TP'[1] includes a first transistor T1', a second transistor T2', a first switch ST1' and a second switch ST2'. A first terminal of the first transistor T1' is coupled at the node N1, and a first terminal of the second transistor T2' receives the ground voltage Gnd. A control terminal of the first transistor T1' and a control terminal of the second transistor T2' receive the input clock signal $CLK_0$ (or, one of the input clock signals $CLK_0$, $CLK_{90}$, $CLK_{180}$ and $CLK_{270}$). The first switch ST1' and the second switch ST2' are connected in series and then are coupled between a second terminal of the first transistor T1' and a second terminal of the second transistor T2'.

As shown in FIG. 4, the reference circuit 50 is further configured to receive a reference digital signal Scode_ref similar to the digital signal Scode. In some embodiments, the amount of bits of the reference digital signal Scode_ref is same as the amount of the bits of the digital signal Scode, but the reference digital signal Scode_ref is set to have a fixed bit configuration (i.e., the predetermined bit configuration). The predetermined bit configuration of the reference digital signal Scode_ref can be one of the bit configurations of the digital signal Scode. It can be appreciated that the predetermined bit configuration of the reference digital signal Scode_ref includes multiple bits, and the transistor pairs TP'[1]-TP'[n] of the reference circuit 50 each receives a corresponding bit of the bits of the reference digital signal Scode_ref.

Furthermore, the reference circuit 50 may not output the synthesized clock signal although receiving the input clock signals $CLK_0$, $CLK_{90}$, $CLK_{180}$ and $CLK_{270}$ and the reference digital signal Scode_ref, because the reference circuit 50 receives those signals only for reflecting the change of the phase interpolator circuit 10 due to the manufacture process variation. It can be appreciated that the power consumption of the reference circuit 50 can also be reduced in the condition of receiving the reference digital signal Scode_ref and not outputting the synthesized clock signal.

In some embodiments, the rise time or the fall time of the transistors inside the reference circuit 50 may be lengthened or shortened due to the manufacture process variation, so as to further affect the magnitude of an equivalent resistance of the reference circuit 50. In some embodiments, the equivalent resistance of the reference circuit 50 includes following components: (1) a resistance error caused by the manufacture process variation; and (2) an ideal resistance set by the predetermined bit configuration of the reference digital signal Scode_ref (that is, the ideal resistance is a resistance caused by the transistor pair TP' of the reference circuit 50 in which the first switch ST1' and the second switch ST2' are turned on without considering the manufacture process variation). The reference information is the equivalent resistance of the reference circuit 50 due to the manufacture process variation. Furthermore, since the reference circuit 50 and the phase interpolator circuit 10 are manufactured with same manufacture process, the reference information provided by the reference circuit 50 is relevant to the change of the phase interpolator circuit 10 due to the manufacture process variation.

As shown in FIG. 3, the temperature sensitive circuit 30 can generate the current $I_{PTAT}$ to the reference circuit 50 according to the operating temperature of the signal converting circuit 300, to generate the node voltage Vnode at the node N1. In the embodiments of FIG. 3, the node voltage Vnode is the current $I_{PTAT}$ multiplies the equivalent resistance of the reference circuit 50. Then, the regulator 40 can receive and stable the node voltage Vnode to generate the bias voltage Vbias to the phase interpolator circuit 10.

Notably, since the reference circuit 50 and the phase interpolator circuit 10 are manufactured with same manufacture process, the bias voltage Vbias generated by the bias voltage generation circuit according to the equivalent resistance of the reference circuit 50 would have a voltage magnitude capable of compensating the manufacture process variation of the phase interpolator circuit 10. For example, when the rise or fall time of the transistors inside the phase interpolator circuit 10 is shortened due to the manufacture process variation, the equivalent resistance of the reference circuit 50 is relatively small. It is assumed that the magnitude of the current $I_{PTAT}$ is fixed due to the stable temperature, the bias voltage generation circuit generates a small bias voltage Vbias to the phase interpolator circuit 10 according to a small node voltage Vnode, to lengthen the rise or fall time of the transistors inside the phase interpolator circuit 10. For another example, if the rise or fall time of the transistors inside the phase interpolator circuit 10 is lengthened due to the manufacture process variation, the equivalent resistance of the reference circuit 50 is relatively large. It is assumed that the magnitude of the current $I_{PTAT}$ is fixed due to the stable temperature, the bias voltage generation circuit generates a large bias voltage Vbias to the phase interpolator circuit 10 according to a large node voltage Vnode, to shorten the rise or fall time of the transistors inside the phase interpolator circuit 10.

Through the descriptions of the embodiments of FIG. 1, it can be appreciated that the bias voltage Vbias generated according to the current $I_{PTAT}$ provided by the temperature sensitive circuit 30 is capable of compensating the temperature variation of the phase interpolator circuit 10. It can be seen from that the signal converting circuit 300 of FIG. 3 can utilize the current $I_{PTAT}$ provided by the temperature sensitive circuit 30 and the equivalent resistance of the reference circuit 50 simultaneously, to generate the bias voltage Vbias capable of compensating the temperature variation and the manufacture process variation of the phase interpolator circuit 10. Accordingly, the phase interpolator circuit 10 can generate the output clock signal CLKout having the predetermined phase corresponding to one of the bit configurations of the digital signal Scode.

In the above embodiments, the bias voltage generation circuit stables the node voltage Vnode by the regulator 40 to generate the bias voltage Vbias, but the present disclosure is not limited herein. It can be seen from above descriptions that the node voltage Vnode has positive correlation with the bias voltage Vbias. Therefore, in some embodiments, the regulator 40 can be omitted, and the bias voltage generation circuit directly outputs the node voltage Vnode as the bias voltage Vbias to the phase interpolator circuit 10.

In the above embodiments, only one output clock signal CLKout is illustrated in FIG. 1 or 3, but the present disclosure is not limited herein. In other embodiments, the phase interpolator circuit 10 can generate two output clock signals which differ from each other by a specific phase (e.g., 180 degrees of phase, 90 degrees of phase). In other words, the phase interpolator circuit of the present disclosure can generate at least one output clock signal.

Figure 5:
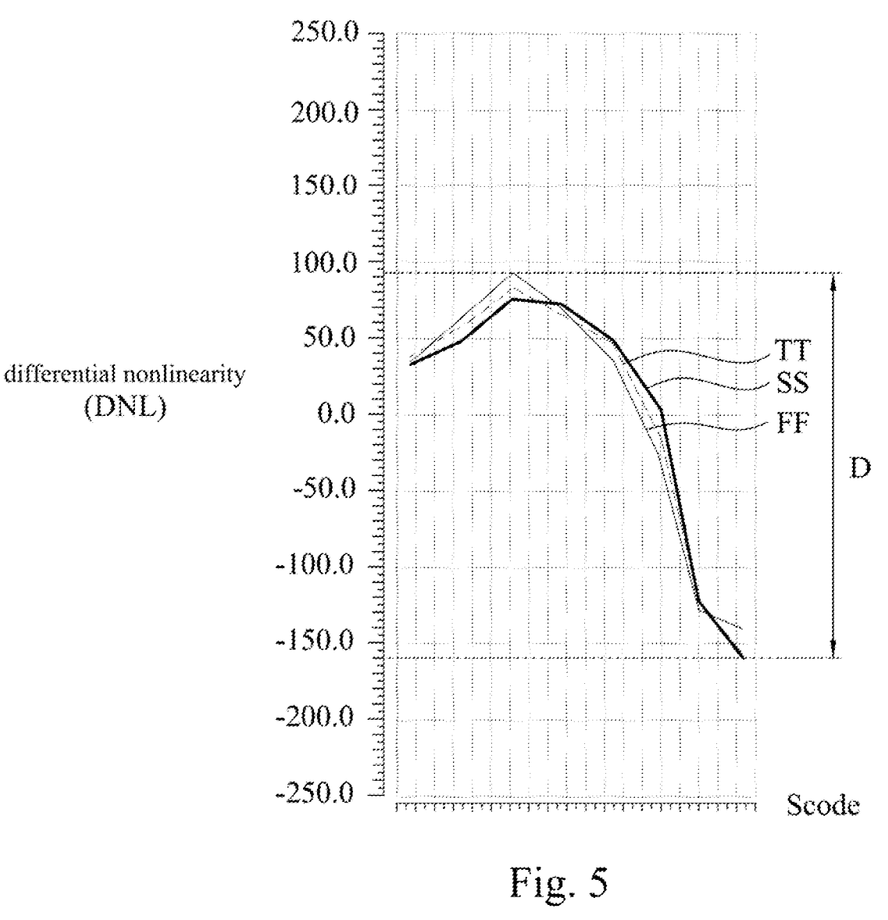
FIG. 5 is a diagram of experimental data of the phase interpolator circuit affected by the temperature variation in accordance with some embodiments of the present disclosure.
Figure 6:
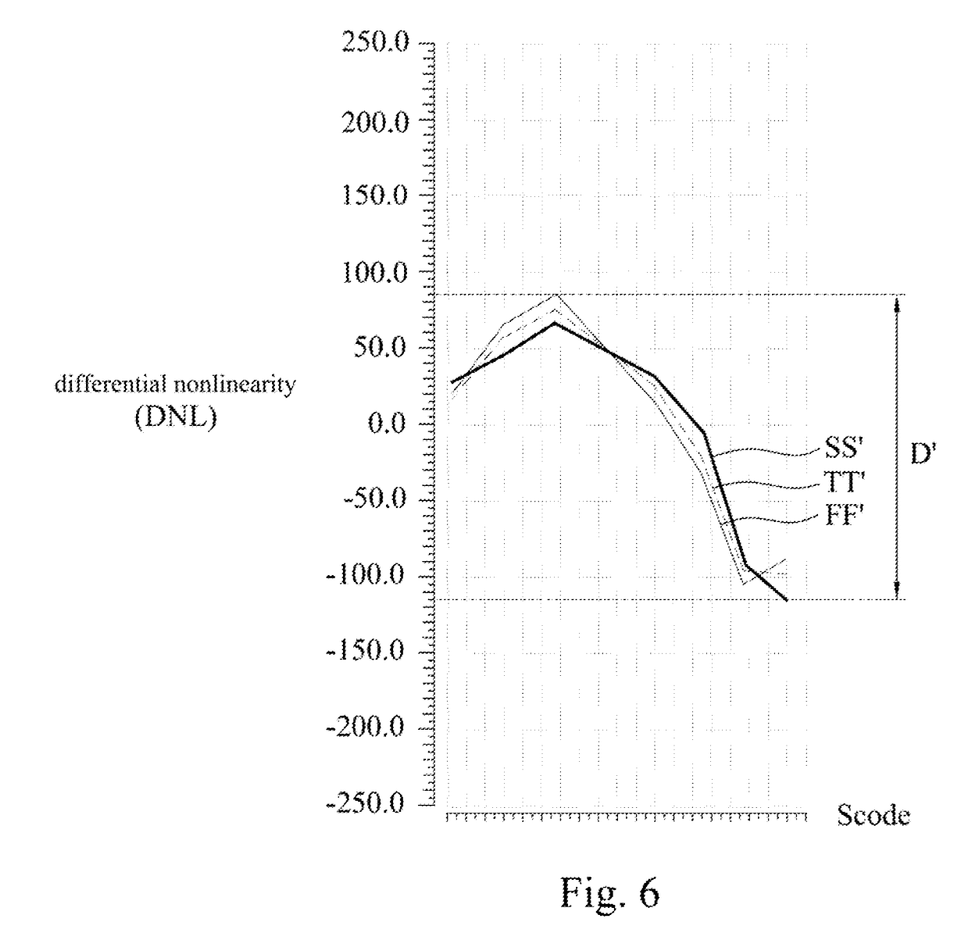
FIG. 6 is a diagram of experimental data of the phase interpolator circuit in which the temperature variation is compensated in accordance with some embodiments of the present disclosure.

Referring to FIGS. 5 and 6, FIG. 5 is a diagram of experimental data of the phase interpolator circuit 10 in which the temperature variation has not been compensated in accordance with some embodiments of the present disclosure. FIG. 6 is a diagram of experimental data of the phase interpolator circuit 10 in which the temperature variation is compensated in accordance with some embodiments of the present disclosure. In FIGS. 5 and 6, multiple scales of the horizontal axis represent the bit configurations of the digital signal Scode, and multiple scales of the vertical axis represent the magnitude of the differential nonlinearity (DNL). It can be appreciated that the smaller the differential nonlinearity is, the higher the linearity of converting circuit is. Therefore, the differential nonlinearity of ideal converting circuit approaches zero.

As shown in FIG. 5, three curves FF (fast-fast), TT (typical-typical) and SS (slow-slow) represent experimental data under three different parameters of manufacture process, and a vertical axis range D represents the magnitude distribution of the differential nonlinearity of the phase interpolator circuit 10 in which the temperature variation has not been compensated. As shown in FIG. 6, three curves FF', TT' and SS' represent experimental data under three different parameters of manufacture process, and a vertical axis range D' represents the magnitude distribution of the differential nonlinearity of the phase interpolator circuit 10 in which the temperature variation is compensated. It can be seen from FIGS. 5 and 6 that the phase interpolator circuit 10 in which the temperature variation is compensated has a better linearity in comparison with the phase interpolator circuit 10 in which the temperature variation has not been compensated. For example, the vertical axis range D' in FIG. 6 is reduced about 22% in comparison with the vertical axis range D in FIG. 5.

As can be seen from the above embodiments of the present disclosure, by compensating the phase interpolator circuit with the appropriate bias voltage generated according to the reference information relevant to the change of the phase interpolator circuit due to the temperature variation and/or the manufacture process variation, the signal converting circuit of the present disclosure has the advantage of increasing the linearity.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A signal converting circuit, comprising:
a phase interpolator circuit configured to convert a plurality of input clock signals into an output clock signal according to a digital signal; and
a bias voltage generation circuit comprising a temperature sensitive circuit and a reference circuit, wherein the bias voltage generation circuit is electrically coupled to the phase interpolator circuit, configured to generate a bias voltage according to a reference information and configured to output the bias voltage to the phase interpolator circuit, so that the output clock signal has a predetermined phase corresponding to one of a plurality of bit configurations of the digital signal,
wherein the reference information is relevant to a change of the phase interpolator circuit due to a temperature variation and another change of the phase interpolator circuit due to a manufacture process variation, and the reference information comprises a temperature dependent current generated by the temperature sensitive circuit according to an operating temperature of the signal converting circuit and an equivalent resistance of the reference circuit due to the manufacture process variation.

2. The signal converting circuit of claim 1, wherein the phase interpolator circuit comprises a plurality of transistor pairs connected in parallel, and the plurality of transistor pairs each is configured to receive a corresponding bit of a plurality of bits of the digital signal,
wherein the plurality of transistor pairs are divided into a plurality of groups, each group of transistor pairs is configured to receive a corresponding input clock signal of the plurality of input clock signals, and the plurality of input clock signals are different from each other in phase.

3. The signal converting circuit of claim 2, wherein the plurality of transistor pairs each comprises a first transistor, a second transistor, a first switch and a second switch;

wherein a first terminal of the first transistor receives the bias voltage, a first terminal of the second transistor receives a ground voltage, and a control terminal of the first transistor and a control terminal of the second transistor receive the corresponding input clock signal of the plurality of input clock signals;

wherein the first switch and the second switch connected in series are coupled between a second terminal of the first transistor and a second terminal of the second transistor and are configured to be selectively turned on according to the corresponding bit of the plurality of bits of the digital signal.

4. The signal converting circuit of claim 1, wherein the temperature sensitive circuit and the reference circuit are coupled at a first node, and the temperature sensitive circuit is configured to generate the temperature dependent current to the reference circuit according to the operating temperature of the signal converting circuit, so as to generate a node voltage at the first node.

5. The signal converting circuit of claim 4, wherein the temperature sensitive circuit comprises:

an amplifier having a positive input terminal, a negative input terminal and an output terminal;

a first reference transistor pair, wherein the first reference transistor pair and the negative input terminal of the amplifier are coupled at a second node;

a second reference transistor pair coupled at a third node;

a resistor, wherein the resistor and the second reference transistor pair are coupled at the third node, and the resistor and the positive input terminal of the amplifier are coupled at a fourth node; and a first bias transistor, a second bias transistor and a third bias transistor, wherein a control terminal of the first bias transistor, a control terminal of the second bias transistor and a control terminal of the third bias transistor are coupled to the output terminal of the amplifier, and a first terminal of the first bias transistor, a first terminal of the second bias transistor and a first terminal of the third bias transistor are coupled to a system high voltage, wherein a second terminal of the first bias transistor is coupled to the second node, a second terminal of the second bias transistor is coupled to the fourth node, and a second terminal of the third bias transistor is coupled to the first node.

6. The signal converting circuit of claim 5, wherein the amplifier, the first bias transistor and the first reference transistor pair constitute a positive feedback path, the amplifier, the second bias transistor, the resistor and the second reference transistor pair constitute a negative feedback path, and the negative feedback path is greater than the positive feedback path in gain.

7. The signal converting circuit of claim 5, wherein the second reference transistor pair is N times larger than the first reference transistor pair in size, wherein N is a positive integer greater than 1.

8. The signal converting circuit of claim 5, wherein the temperature dependent current is a cross voltage between the fourth node and the third node divided by a resistance of the resistor and has positive correlation with temperature.

9. The signal converting circuit of claim 4, wherein the bias voltage generation circuit further comprises a regulator, the regulator is coupled between the first node and the phase interpolator circuit, and the regulator is configured to receive and stable the node voltage to generate the bias voltage to the phase interpolator circuit.

10. The signal converting circuit of claim 1, wherein:

the reference circuit is a replicated circuit of the phase interpolator circuit and configured to reflect the another change of the phase interpolator circuit due to the manufacture process variation, wherein the bias voltage generation circuit generates the bias voltage according to the equivalent resistance and the temperature dependent current inputted to the reference circuit.

11. The signal converting circuit of claim 10, wherein the reference circuit comprises a plurality of transistor pairs connected in parallel and is configured to receive a reference digital signal and the plurality of input clock signals, wherein the reference digital signal has a predetermined bit configuration, the predetermined bit configuration of the reference digital signal comprises a plurality of bits, and the plurality of transistor pairs each receives a corresponding bit of the plurality of bits of the reference digital signal, wherein the plurality of transistor pairs are divided into a plurality of groups, each group of transistor pairs is configured to receive a corresponding input clock signal of the plurality of input clock signals, and the plurality of input clock signals are different from each other in phase.

12. The signal converting circuit of claim 10, wherein the temperature dependent current has positive correlation with temperature.

* * * * *